(12) United States Patent
Uehira et al.

(10) Patent No.: US 9,074,020 B2
(45) Date of Patent: *Jul. 7, 2015

(54) CELLULOSE DERIVATIVE, RESIN COMPOSITION, MOLDED BODY, METHOD FOR PREPARATION THEREOF, AND CASE FOR ELECTRIC AND ELECTRONIC DEVICE

(75) Inventors: Shigeki Uehira, Minami-Ashigara (JP); Youichirou Takeshima, Odawara (JP)

(73) Assignee: FUJIFILM CORPORATION, Tokyo (JP)

( * ) Notice: Subject to any disclaimer, the term of this patent is extended or adjusted under 35 U.S.C. 154(b) by 463 days.

This patent is subject to a terminal disclaimer.

(21) Appl. No.: 13/389,988

(22) PCT Filed: Aug. 11, 2010

(86) PCT No.: PCT/JP2010/063662
§ 371 (c)(1),
(2), (4) Date: Mar. 5, 2012

(87) PCT Pub. No.: WO2011/019064
PCT Pub. Date: Feb. 17, 2011

(65) Prior Publication Data
US 2012/0146468 A1 Jun. 14, 2012

(30) Foreign Application Priority Data

Aug. 12, 2009 (JP) ................ 2009-187416
Dec. 25, 2009 (JP) ................ 2009-295059

(51) Int. Cl.
C08B 11/193 (2006.01)
C08B 13/00 (2006.01)
C08J 5/00 (2006.01)
C08L 1/32 (2006.01)
H05K 5/00 (2006.01)

(52) U.S. Cl.
CPC . *C08B 13/00* (2013.01); *C08J 5/00* (2013.01); *C08L 1/32* (2013.01); *H05K 5/00* (2013.01)

(58) Field of Classification Search
CPC ............... C08B 13/00; C08L 1/32; C08J 5/00
USPC ................................................. 536/64, 65, 90
See application file for complete search history.

(56) References Cited

U.S. PATENT DOCUMENTS

| 4,226,981 A * | 10/1980 | Onda et al. ............ 536/66 |
| 4,506,066 A | 3/1985 | Medem et al. |
| 5,639,865 A | 6/1997 | Kalbe et al. |
| 6,326,125 B1 | 12/2001 | Kakinuma et al. |
| 6,362,330 B1 | 3/2002 | Simon et al. |
| 2001/0053791 A1 | 12/2001 | Babcock et al. |
| 2002/0187190 A1 | 12/2002 | Cade et al. |
| 2003/0072801 A1 | 4/2003 | Curatolo et al. |
| 2004/0013734 A1 | 1/2004 | Babcock et al. |
| 2006/0060821 A1 | 3/2006 | Fujisawa et al. |
| 2006/0122384 A1 | 6/2006 | Hayakawa et al. |
| 2007/0048384 A1 | 3/2007 | Rosenberg et al. |
| 2010/0190953 A1 | 7/2010 | Fuji et al. |
| 2011/0257362 A1 | 10/2011 | Fuji et al. |

FOREIGN PATENT DOCUMENTS

| DE | 44 04 840 A1 | 8/1995 |
| DE | 197 14 059 A1 | 10/1998 |
| EP | 2 174 974 A1 | 4/2010 |
| GB | 396796 A | 8/1933 |
| JP | 092294 C2 | 4/1931 |
| JP | 46-43104 | 12/1971 |
| JP | 56-55425 A | 5/1981 |
| JP | 2-86638 A | 3/1990 |
| JP | 3-149705 A | 6/1991 |
| JP | 11-249301 A | 9/1999 |
| JP | 2000-229887 A | 8/2000 |
| JP | 2000-319311 A | 11/2000 |
| JP | 2001-506692 A | 5/2001 |
| JP | 2003-026607 A | 1/2003 |
| JP | 2003-526666 A | 9/2003 |
| JP | 2004-163452 A | 6/2004 |
| JP | 2005-162876 A | 6/2005 |
| JP | 2005-194302 A | 7/2005 |
| JP | 2005194302 A * | 7/2005 ............... C08L 1/08 |
| JP | 2006-152276 A | 6/2006 |

(Continued)

OTHER PUBLICATIONS

International Search Report (PCT/ISA/210) issued on Sep. 14, 2010, by Japanese Patent Office as the International Searching Authority for International Application No. PCT/JP2010/063662.

Written Opinion (PCT/ISA/237) issued on Sep. 14, 2010, by Japanese Patent Office as the International Searching Authority for International Application No. PCT/JP2010/063662.

Office Action (Reasons) issued on Jan. 14, 2014, by the Japan Patent Office in corresponding Japanese Patent Application No. 2009-295059 and an English translation of the Office Action. (15 pages).

International Preliminary Report on Patentability (Form PCT/IB/373) and the Written Opinion of the International Searching Authority (Form PCT/ISA/237) issued on Mar. 13, 2012, in the corresponding International Application No. PCT/JP2010/063662. (13 pages).

(Continued)

*Primary Examiner* — Ganapathy Krishnan

(74) *Attorney, Agent, or Firm* — Buchanan, Ingersoll & Rooney PC

(57) ABSTRACT

A cellulose derivative, contains A) a hydrocarbon group; B) a group containing an acyl group: —CO—$R_B$ and an ethyleneoxy group: —$C_2H_4$—O— ($R_B$ represents a hydrocarbon group); and C) an acyl group: —CO—$R_C$ ($R_C$ represents a hydrocarbon group). A method for preparing the cellulose derivative, a resin composition containing the cellulose derivative, a case for an electric and electronic device and a method for preparing a molded body are also provided.

11 Claims, No Drawings

(56) References Cited

FOREIGN PATENT DOCUMENTS

| JP | 2008-24919 | A | | 2/2008 | |
|----|----|----|----|----|----|
| JP | 2009-35515 | A | | 2/2009 | |
| JP | 4228467 | B2 | * | 2/2009 | ................ C03C 8/16 |

OTHER PUBLICATIONS

The extended European Search Report dated Aug. 30, 2013, issued in corresponding European Patent Application No. 10808247.0. (5 pages).

Notification of the First Office Action dated Mar. 21, 2013, issued by the Chinese Patent Office in the corresponding Chinese Patent Application No. 201080035806.4, and an English translation thereof. (15 pages).

Taiwanese Office Action (Preliminary Notice of First Office Action) dated Oct. 21, 2014, issued in corresponding Taiwanese Patent Application No. 10321455900, and English language translation of Office Action. (10 pages).

Office Action issued on Oct. 28, 2014, by the Japanese Patent Office in Japanese Patent Application No. 2009-295059, and an English translation of the Office Action (14 pages).

Chinese Office Action (Notification of $3^{rd}$ Office Action) dated Jun. 19, 2014, issued by the State Intellectual Property Office of the People's Republic of China in corresponding Chinese Patent Application No. 201080035806.4, and English language translation of Office Action. (13 pages).

Office Action dated Oct. 27, 2014, issued in corresponding Chinese Patent Application No. 201080035806.4, and English language translation of Office Action. (13 pages).

* cited by examiner

US 9,074,020 B2

CELLULOSE DERIVATIVE, RESIN COMPOSITION, MOLDED BODY, METHOD FOR PREPARATION THEREOF, AND CASE FOR ELECTRIC AND ELECTRONIC DEVICE

TECHNICAL FIELD

The present invention relates to a cellulose derivative, a resin composition, a molded body, a method for preparation thereof, and a case for electric and electronic devices.

BACKGROUND ART

In members constituting electric and electronic devices such as a copy machine and a printer, various materials are used in consideration of characteristics and functions required for the members. For example, for a member (case) that plays a role of receiving a driving apparatus of an electric and electronic device or the like, and protecting the driving apparatus, a large amount of PC (polycarbonate), an ABS (acrylonitrile-butadiene-styrene) resin, PC/ABS or the like are generally used (Patent Document 1). These resins are prepared by reacting compounds obtained by using petroleum as a raw material.

By the way, fossil resources, such as petroleum, coal and natural gas, include carbon fixed under the earth over a long period of time as a main component. In the case where carbon dioxide is discharged into the atmosphere by combusting such fossil resources or products using the fossil resources as a raw material, carbon that does not exist in the atmosphere but is fixed deeply under the earth, is rapidly discharged as carbon dioxide, and thus, carbon dioxide in the atmosphere is largely increased, thereby causing a global warming. Accordingly, a polymer such as ABS and PC having petroleum, which is a fossil resource, as a raw material has excellent properties as a material of the member for electric and electronic devices, but since petroleum, which is a fossil resource, is used as the raw material, it is preferable that the amount used is decreased from the standpoint of preventing the global warming.

Meanwhile, a plant-derived resin is basically generated by a photosynthesis reaction using water and carbon dioxide in the atmosphere as raw materials by plants. Therefore, there is an opinion that, although carbon dioxide is generated by combusting a plant-derived resin, the carbon dioxide corresponds to carbon dioxide previously existing in the atmosphere, and thus, the balance of carbon dioxide in the atmosphere becomes zero-sum, such that the total amount of $CO_2$ in the atmosphere is not increased. Based on this opinion, the plant-derived resin is called a "carbon neutral" material. The use of the carbon neutral material instead of the petroleum-derived resin has gained importance in preventing the current global warming.

Therefore, in the PC polymer, there is proposed a method for decreasing petroleum-derived resources by using plant-derived resources such as starch as a portion of the petroleum-derived raw materials (Patent Document 2).

However, there is a need for further improvement from the standpoint of targeting a more perfect carbon neutral material.

RELATED ART

Patent Document

Patent Document 1: Japanese Patent Application Laid-Open No. Sho 56-55425

Patent Document 2: Japanese Patent Application Laid-Open No. 2008-24919

DISCLOSURE OF INVENTION

Problems to be Solved by the Invention

The present inventors paid an attention on using cellulose as a carbon neutral resin. Generally, however, cellulose does not have thermoplasticity, and therefore it is not appropriate for molding processing due to difficulty in molding by heating and the like. In addition, even if thermoplasticity could be imparted to cellulose, there still is the problem that strength such as impact resistance is largely deteriorated. There is also room for improvement on heat resistance.

An object of the present invention is to provide a cellulose derivative and a resin composition that have good thermoplasticity, strength and heat resistance, and are suitable for molding processing.

Means for Solving the Problems

The present inventors found out, in consideration of a molecular structure of cellulose, that a cellulose derivative having a specific structure exhibits good thermoplasticity, impact resistance and heat resistance, thereby completing the present invention.

That is, the above object can be accomplished by the following means.

[1] A cellulose derivative, comprising
  A) a hydrocarbon group;
  B) a group containing an acyl group: —CO—$R_B$ and an ethyleneoxy group: —$C_2H_4$—O— ($R_B$ represents a hydrocarbon group); and
  C) an acyl group: —CO—$R_C$ ($R_C$ represents a hydrocarbon group).

[2] The cellulose derivative of [1] above, wherein A) the hydrocarbon group is an alkyl group having 1 to 4 carbon atoms.

[3] The cellulose derivative of [1] above, wherein A) the hydrocarbon group is a methyl group or an ethyl group.

[4] The cellulose derivative of any one of [1] to [3] above, wherein B) the group containing an acyl group: —CO—$R_B$ and an ethyleneoxy group: —$C_2H_4$—O— is a group containing a structure represented by the following Formula (1):

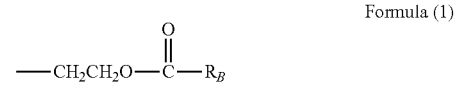

Formula (1)

(wherein $R_B$ represents a hydrocarbon group.)

[5] The cellulose derivative of any one of [1] to [4] above, wherein each of $R_B$ and $R_C$ independently represents an alkyl group or an aryl group.

[6] The cellulose derivative of any one of [1] to [4] above, wherein each of $R_B$ and $R_C$ independently represents a methyl group, an ethyl group or a propyl group.

[7] The cellulose derivative of any one of [1] to [6] above, wherein the cellulose derivative has substantially no carboxyl group.

[8] A method for preparing the cellulose derivative of any one of [1] to [7] above, comprising a process of esterifying a cellulose ether containing a hydrocarbon group and a hydroxyethyl group: —$C_2H_4$—OH.

[9] A resin composition comprising the cellulose derivative of any one of [1] to [8] above.

[10] A case for electric and electronic device, composed of a molded body obtained by heating and molding the cellulose derivative of any one of [1] to [7] above or the resin composition of [9] above.

[11] A method for preparing a molded body, comprising:
a step of heating and molding the cellulose derivative of any one of [1] to [8] above or the resin composition of [9] above.

Effects of the Invention

The cellulose derivative or resin composition of the present invention has excellent thermoplasticity, and thus, may be manufactured into a molded body. Further, a molded body formed by the cellulose derivative or resin composition of the present invention has good impact resistance, heat resistance, and the like, and thus, may be used appropriately as component parts such as automobiles, home electric appliances, electric and electronic devices, mechanical parts, materials for housing and construction, and the like. In addition, the cellulose derivative or resin composition of the present invention is a plant-derived resin and is a material which may contribute to the prevention of global warming, and thus, the cellulose derivative or resin composition of the present invention may replace petroleum-derived resins of the related art. Furthermore, the cellulose derivative and resin composition of the present invention exhibit biodegradability, and thus, are expected to be used as a material with less environmental load.

EMBODIMENTS FOR CARRYING OUT THE INVENTION

Hereinafter, the present invention will be described in detail.

1. Cellulose Derivative

A cellulose derivative of the present invention contains:
A) a hydrocarbon group,
B) a group containing an acyl group: —CO—$R_B$ and an ethyleneoxy group: —$C_2H_4$—O— ($R_B$ represents a hydrocarbon group), and
C) an acyl group: —CO—$R_C$ ($R_C$ represents a hydrocarbon group).

That is, the cellulose derivative in the present invention is obtained by substituting at least a portion of hydrogen atoms of a hydroxyl group contained in the cellulose $\{(C_6H_{10}O_5)_n\}$ with A) the hydrocarbon group, B) the group containing an acyl group (—CO—$R_B$) and an ethyleneoxy group (—$C_2H_4$—O—), and C) the acyl group (—CO—$R_C$).

More specifically, the cellulose derivative in the present invention has a repeating unit represented by the following Formula (2).

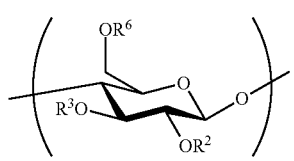

Formula (2)

In the formula, each of $R^2$, $R^3$ and $R^6$ independently represents a hydrogen atom, A) a hydrocarbon group, B) a group containing an acyl group (—CO—$R_B$) and an ethyleneoxy group (—$C_2H_4$—O—), or C) an acyl group (—CO—$R_C$). Each of $R_B$ and $R_C$ independently represents a hydrocarbon group. However, at least a portion of $R^2$, $R^3$ and $R^6$ represents a hydrocarbon group and at least a portion of $R^2$, $R^3$ and $R^6$ represents a group containing an acyl group (—CO—$R_B$) and an ethyleneoxy group (—$C_2H_4$—O—), and at least a portion of $R^2$, $R^3$ and $R^6$ represents an acyl group (—CO—$R_C$).

The cellulose derivative of the present invention is novel compounds, and may exhibit thermoplasticity because at least a portion of the hydroxyl groups of the β-glucose ring is etherified and esterified by A) the hydrocarbon group, B) the group containing an acyl group (—CO—$R_B$) and an ethyleneoxy group (—$C_2H_4$—O—), and C) the acyl group (—CO—$R_C$), as described above, thereby being appropriate for molding processing.

In addition, the cellulose derivative may exhibit excellent strength and heat resistance as a molded body, and particularly is useful as a thermo-molding material. Furthermore, since cellulose is a completely plant-derived component, cellulose is carbon neutral and may greatly reduce the environmental load.

As used herein, "cellulose" means a polymer compound in which a plurality of glucose are linked by β-1,4-glycoside bonds with the hydroxyl groups bonded to the carbon atoms at the 2-, 3- and 6-position of each glucose ring of the cellulose being unsubstituted. Further, "hydroxyl groups contained in the cellulose" represents a hydroxyl group which is bonded to the carbon atoms at the 2-, 3- and 6-position of each glucose ring of the cellulose.

The cellulose derivative in the present invention contains:
at least one group in which a hydrogen atom of a hydroxyl group contained in the cellulose is substituted by A) a hydrocarbon group,
at least one group in which a hydrogen atom of a hydroxyl group contained in the cellulose is substituted by B) a group containing an acyl group (—CO—$R_B$) ($R_B$ represents a hydrocarbon group) and an ethyleneoxy group (—$C_2H_4$—O—), and
at least one group in which a hydrogen atom of a hydroxyl group contained in the cellulose is substituted by C) a acyl group (—CO—$R_C$) ($R_C$ represents a hydrocarbon group).

The cellulose derivative of the present invention may have two or more different kinds of groups as the A) to C).

The cellulose derivative may contain A) the hydrocarbon group, B) the group containing an acyl group (—CO—$R_B$) and an ethyleneoxy group (—$C_2H_4$—O—), and C) the acyl group (—CO—$R_C$) at any one part of the whole thereof, and may be composed of the same repeating unit and of a plurality of repeating units. In addition, it is not necessary for the cellulose derivative to contain all the substituents of the A) to C) in a single repeating unit.

As more specific aspects, there may be the following aspects.

(1) A cellulose derivative composed of a repeating unit in which a portion of $R^2$, $R^3$ and $R^6$ is substituted with A) a hydrocarbon group, a repeating unit in which a portion of $R^2$, $R^3$ and $R^6$ is substituted with B) a group containing an acyl group (—CO—$R_B$) and an ethyleneoxy group (—$C_2H_4$—O—), and a repeating unit in which a portion of $R^2$, $R^3$ and $R^6$ is substituted with C) an acyl group (—CO—$R_C$).

(2) A cellulose derivative composed of the same repeating units in which any one of $R^2$, $R^3$ and $R^6$ in a single repeating unit is substituted with A) a hydrocarbon group, B) a group containing an acyl group (—CO—$R_B$) and an ethyleneoxy group (—$C_2H_4$—O—), and C) an acyl group (—CO—$R_C$) (that is, having all the substituents of A) to C) in a single repeating unit).

(3) A cellulose derivative in which repeating units of different substitution positions or different kinds of the substituents in A) to C) are randomly linked.

In addition, a part of the cellulose derivative may contain an unsubstituted repeating unit (that is, a repeating unit in which all of $R^2$, $R^3$ and $R^6$ are a hydrogen atom in formula (1)).

A) the hydrocarbon group may be any one of an aliphatic group and an aromatic group. When the hydrocarbon group is an aliphatic group, it may be straight, branched or cyclic and may have an unsaturated bond. Examples of the aliphatic group include an alkyl group, a cycloalkyl group, an alkenyl group, an alkynyl group and the like. Examples of the aromatic group may include a phenyl group, a naphthyl group, a phenanthryl group, an anthryl group and the like.

A) the hydrocarbon group is preferably an aliphatic group, more preferably an alkyl group, and even more preferably an alkyl group having 1 to 4 carbon atoms (a lower alkyl group). Specific examples thereof include a methyl group, an ethyl group, a propyl group, an isopropyl group, a butyl group, an isobutyl group, a pentyl group, a hexyl group, a heptyl group, a 2-ethylhexyl group, a tert-butyl group, an isoheptyl group, and the like, with a methyl group or an ethyl group being preferred.

In the acyl group (—CO—$R_B$) in B), $R_B$ represents a hydrocarbon group. $R_B$ may be any one of an aliphatic group and an aromatic group. When $R_B$ is an aliphatic group, it may be straight, branched or cyclic and may have an unsaturated bond. The aliphatic group and aromatic group represented by $R_B$ may include the same as those described in A) the hydrocarbon group.

$R_B$ may include preferably an alkyl group or an aryl group. The alkyl group or aryl group is preferably an alkyl group having 1 to 12 carbon atoms or an aryl group, more preferably an alkyl group having 1 to 12 carbon atoms, even more preferably an alkyl group having 1 to 4 carbon atoms, and most preferably an alkyl group having 1 or 2 carbon atoms (that is, a methyl group or an ethyl group).

Specific examples of the $R_B$ include a methyl group, an ethyl group, a propyl group, an isopropyl group, a butyl group, an isobutyl group, a pentyl group, a hexyl group, a heptyl group, a 2-ethylhexyl group, a tert-butyl group, an isoheptyl group and the like. Preferably, $R_B$ is a methyl group, an ethyl group and a propyl group.

B) the group containing an acyl group (—CO—$R_B$) and an ethyleneoxy group (—$C_2H_4$—O—) is preferably a group containing a structure represented by the following formula (1).

[Chem. 3]

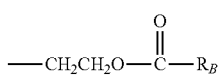

Formula (1)

In the formula, $R_B$ represents a hydrocarbon group.

The definition and preferable range of $R_B$ in formula (1) are the same as those previously described.

The group of B) may include a plurality of ethyleneoxy groups, or only one group. More specifically, the group of B) may be represented by the following formula (1').

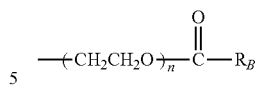

Formula (1')

In the formula, $R_B$ represents a hydrocarbon group. n represents the repeating number, and is a number of 1 or more.

The definition and preferable range of $R_B$ in Formula (1') are the same as those previously described.

The upper limit of n is not particularly limited and changes depending on the amount of ethyleneoxy groups introduced. However, the upper limit is, for example, about 10.

In the cellulose derivative of the present invention, a mixture of the group containing only one ethyleneoxy group in B) (a group in which n is 1 in formula (1')) and the group containing two or more ethylene groups in B) (a group in which n is 2 or more in formula (1')) may be contained.

In C) the acyl group (—CO—$R_C$), $R_C$ represents a hydrocarbon group. As a hydrocarbon group represented by $R_C$, one exemplified in the $R_B$ may be applied. The preferable range of $R_C$ is the same as that of the $R_B$.

In the cellulose derivative of the present invention, A) the hydrocarbon group, and the hydrocarbon group represented by $R_B$ and $R_C$ and ethylene group may have further substituents, or may be unsubstituted, but is preferably unsubstituted.

In particular, when $R_B$ and $R_C$ have further substituents, it is preferred that a substituent which imparts water solubility, for example, a sulfonic acid group, a carboxyl group and the like, is not contained. A cellulose derivative which is water-insoluble and a molding material composed of the cellulose derivative may be obtained by excluding such a group.

When A) the hydrocarbon group, $R_B$, $R_C$ and the ethylene group have further substituents in the cellulose derivative of the present invention, examples of the substituent include a halogen atom (for example, a fluorine atom, a chlorine atom, a bromine atom and an iodine atom), a hydroxyl group, an alkoxy group (the number of carbons of an alkyl moiety is preferably 1 to 5), an alkenyl group and the like. Meanwhile, when A) the hydrocarbon group, $R_B$ or $R_C$ are other than an alkyl group, it is possible to have an alkyl group (preferably 1 to 5 carbon atoms) as a substituent.

Further, when the cellulose derivative of the present invention is used as a molding material, the derivative is preferably water-insoluble. For this reason, it is preferred that the cellulose derivative has substantially no water-soluble substituent such as a carboxyl group, a sulfonic acid group and salts thereof. The cellulose derivative may have substantially no carboxyl group so as to be water-insoluble, thereby being more appropriate for molding processing.

As used herein, "having substantially no carboxyl group" means to include the case where the cellulose derivative in the present invention has absolutely no carboxyl group, as well as the case where the cellulose derivative in the present invention has a very small amount of a carboxyl group in a range that the cellulose derivative is water-insoluble. For example, when a carboxyl group is contained in a raw material cellulose, a cellulose derivative in which the substituent of A) to C) is introduced by using the cellulose may contain a carboxyl group. However, the cellulose derivative is meant to be included in "a cellulose derivative having substantially no carboxyl group".

In addition, "water-insoluble" means that the solubility in 100 parts by mass of water (pH 3 to 11) at 25° C. is 5 parts by mass or less.

The carboxyl group included in the cellulose derivative of the present invention is included in an amount of preferably 1% by mass or less and more preferably 0.5% by mass or less, based on the cellulose derivative.

Specific examples of the cellulose derivative of the present invention include acetoxyethylmethylacetyl cellulose, acetoxyethylethylacetyl cellulose, acetoxyethylpropylacetyl cellulose, acetoxyethylbutylacetyl cellulose, acetoxyethylpentylacetyl cellulose, acetoxyethylhexylacetyl cellulose, acetoxyethylcyclohexylacetyl cellulose, acetoxyethylphenylacetyl cellulose, acetoxyethylnaphthylacetyl cellulose, acetoxyethylmethylpropionyl cellulose, acetoxyethylethylpropionyl cellulose, acetoxyethylpropylpropionyl cellulose, acetoxyethylbutylpropionyl cellulose, acetoxyethylpentylpropionyl cellulose, acetoxyethylhexylpropionyl cellulose, acetoxyethylcyclohexylpropionyl cellulose, acetoxyethylphenylpropionyl cellulose, acetoxyethylnaphthylpropionyl cellulose, acetoxyethylmethylcellulose-2-ethylhexanoate, acetoxyethylethylcellulose-2-ethylhexanoate, acetoxyethylpropylcellulose-2-ethylhexanoate, acetoxyethylbutylcellulose-2-ethylhexanoate, acetoxyethylpentylcellulose-2-ethylhexanoate, acetoxyethylhexylcellulose-2-ethylhexanoate, acetoxyethylcyclohexylcellulose-2-ethylhexanoate, acetoxyethylphenylcellulose-2-ethylhexanoate, acetoxyethylnaphthylcellulose-2-ethylhexanoate, propionyloxyethylmethylacetyl cellulose, propionyloxyethylethylacetyl cellulose, propionyloxyethylpropylacetyl cellulose, propionyloxyethylbutylacetyl cellulose, propionyloxyethylpentylacetyl cellulose, propionyloxyethylhexylacetyl cellulose, propionyloxyethylcyclohexylacetyl cellulose, propionyloxyethylphenylacetyl cellulose, propionyloxyethylnaphthylacetyl cellulose, propionyloxyethylmethylpropionyl cellulose, propionyloxyethylethylpropionyl cellulose, propionyloxyethylpropylpropionyl cellulose, propionyloxyethylbutylpropionyl cellulose, propionyloxyethylpentylpropionyl cellulose, propionyloxyethylhexylpropionyl cellulose, propionyloxyethylcyclohexylpropionyl cellulose, propionyloxyethylphenylpropionyl cellulose, propionyloxyethylnaphthylpropionyl cellulose, propionyloxyethylmethylcellulose-2-ethylhexanoate, propionyloxyethylethylcellulose-2-ethylhexanoate, propionyloxyethylpropylcellulose-2-ethylhexanoate, propionyloxyethylbutylcellulose-2-ethylhexanoate, propionyloxyethylpentylcellulose-2-ethylhexanoate, propionyloxyethylhexylcellulose-2-ethylhexanoate, propionyloxyethylcyclohexylcellulose-2-ethylhexanoate, propionyloxyethylphenylcellulose-2-ethylhexanoate, propionyloxyethylnaphthylcellulose-2-ethylhexanoate and the like.

The positions of substitution of A) the hydrocarbon group, B) the group containing an acyl group (—CO—$R_B$) and an ethyleneoxy group (—$C_2H_4$—O—), and C) the acyl group (—CO—$R_C$) in the cellulose derivative and the numbers of each substituent per β-glucose ring unit (the degrees of substitution) are not particularly limited.

For example, the degree of substitution DSa of A) the hydrocarbon group (the number of A) the hydrocarbon groups with respect to the hydroxyl groups at the 2-, 3- and 6-positions of a β-glucose ring in a repeating unit) is preferably 1.0<DSa and more preferably 1.0<DSa<2.5.

The degree of substitution DSb of B) the group containing an acyl group (—CO—$R_B$) and an ethyleneoxy group (—$C_2H_4$—O—) (the number of B) the groups containing the acyl group and the ethyleneoxy group with respect to the hydroxyl groups at the 2-, 3- and 6-positions of a cellulose structure of a β-glucose ring in a repeating unit) is preferably 0<DSb. Since the melting initiation temperature may be lowered in a range of 0<DSb, the thermo-molding may be more easily performed.

The degree of substitution DSc of C) the acyl group (—CO—$R_C$) (the number of C) the acyl groups with respect to the hydroxyl groups at the 2-, 3- and 6-positions of a cellulose structure of a β-glucose ring in a repeating unit) is preferably 0.1<DSc and more preferably 0.1<DSc<2.0.

Further, the number of unsubstituted hydroxyl groups in the cellulose derivative is not particularly limited, either. The degree DSh of substitution of hydrogen atoms (the ratio that hydroxyl groups at the 2-, 3- and 6-positions in a repeating unit are unsubstituted) may be in a range of 0 to 1.5, and preferably 0 to 0.6. The fluidity of a thermo-molding material may be enhanced or foaming due to water absorption of the thermo-molding material at the time of acceleration and molding of thermal decomposition, and the like may be suppressed by setting the DSh to 0.6 or less.

In addition, the cellulose derivative in the present invention may have a substituent other than A) the hydrocarbon group, B) the group containing an acyl group (—CO—$R_B$) and an ethyleneoxy group (—$C_2H_4$—O—), and C) the acyl group (—CO—$R_C$). Examples of the substituent which the cellulose derivative may have include a hydroxyethyl group, a hydroxyethoxyethyl group and hydroxyethoxyethoxyethyl group. Therefore, although the total sum of each degree of substitution of all the substituents that the cellulose derivative has is 3, the (DSa+DSb+DSc+DSh) is 3 or less.

In addition, the amount of an ethyleneoxy group introduced in the group of B) is represented by a molar degree of substitution (MS: the number of moles of substituents introduced per glucose residue) (Cellulose Dictionary P142, edited by Cellulose Society of Japan). The molar degree of substitution MS of the ethyleneoxy group is preferably 0<MS, more preferably 0<MS≤1.5, and even more preferably 0<MS<1.0. Since MS is 1.5 or less (MS≤1.5), heat resistance·moldability, and the like may be improved, and thus a cellulose derivative appropriate for a thermo-molding material may be obtained.

In the molecular weight of the cellulose derivative, the number average molecular weight (Mn) is preferably in a range of $5 \times 10^3$ to $1000 \times 10^3$, more preferably in a range of $10 \times 10^3$ to $800 \times 10^3$, and most preferably in a range of $10 \times 10^3$ to $500 \times 10^3$. In addition, the weight average molecular weight (Mw) thereof is preferably in a range of $7 \times 10^3$ to $10,000 \times 10^3$, more preferably in a range of $100 \times 10^3$ to $5,000 \times 10^3$, and most preferably in a range of $500 \times 10^3$ to $5,000 \times 10^3$. The moldability, mechanical strength and the like of a molded body may be improved by setting the average molecular weight in that range.

The molecular weight distribution (MWD) is preferably in a range of 1.1 to 10.0 and more preferably in a range of 2.0 to 8.0. Moldability and the like may be improved by setting the molecular weight distribution in that range.

In the present invention, the number average molecular weight (Mn), the weight average molecular weight (Mw), and the molecular weight distribution (MWD) may be determined by using a gel permeation chromatography (GPC). Specifically, N-methylpyrrolidone is used as a solvent and a polystyrene gel is used, and the molecular weight may be obtained by using a reduced molecular weight calibration curve previously prepared from a standard monodispersion polystyrene constitution curve.

2. Preparation Method of Cellulose Derivative

The preparation method of the cellulose derivative in the present invention is not particularly limited, and the cellulose derivative of the present invention may be prepared by using cellulose as a raw material and subjecting the cellulose to etherification and esterification. Any raw material of cellulose may be used, including, for example, cotton, linter, pulp and the like.

A preferred embodiment of the preparation method of the cellulose derivative in the present invention is performed by a method including a process of allowing, for example, cellulose ether having a hydrocarbon group and a hydroxyethyl group: —$C_2H_4$—OH to react with, for example, acid chloride or acid anhydride to perform esterification (acylation).

In addition, as another embodiment, methods including processes of etherification of cellulose ether (for example, methyl cellulose, ethyl cellulose and the like) with ethyleneoxide and the like, or etherification of allowing alkyl chloride such as methyl chloride and ethyl chloride/ethylene oxide to react with cellulose and then follow by reaction with an acid chloride or an acid anhydride to perform esterification may be included.

As a method of reacting the acid chloride, for example, a method described in Cellulose 10; 283-296, 2003 may be used.

The cellulose derivative of the present invention may be obtained through esterification of hydroxyethylalkyl cellulose. Since the esterification occurs for hydroxyl groups of a hydroxyethyl group and hydroxyl groups of cellulose, a plurality of esterified hydroxylethyl groups and esterified celluloses may be obtained by using a plurality of esterifying agents (anhydride/acid chloride) to perform a reaction.

Specific examples of the cellulose ether having a hydrocarbon group and a hydroxyethyl group include hydroxyethylmethyl cellulose, hydroxyethylethyl cellulose, hydroxyethylpropyl cellulose, hydroxyethylallyl cellulose, hydroxyethylbenzyl cellulose and the like. Preferably, the examples thereof are hydroxyethylmethyl cellulose and hydroxyethylethyl cellulose.

In the case of hydroxyethylmethyl cellulose, those commercially available may be used. In commercially available products, there are a plurality of degrees of substitution, and for a type having each degree of substitution, a viscosity level is represented by a viscosity value of a 2% aqueous solution at 20° C., and the viscosity value is about 1 to 200,000. Generally, those types having a high viscosity level have higher molecular weights (Mn and Mw) than those having a low viscosity level. The molecular weight of a cellulose derivative produced may be controlled by changing the viscosity level to be used.

As the acid chloride, carboxylic acid chloride corresponding to the acyl group included in the B) and C) the acyl group may be used. Examples of carboxyl acid chloride include acetyl chloride, propionyl chloride, butyryl chloride, isobutyryl chloride, pentanoyl chloride, 2-methylbutanoyl chloride, 3-methylbutanoyl chloride, pyvaloyl chloride, hexanoyl chloride, 2-methylpentanoyl chloride, 3-methylpentanoyl chloride, 4-methylpentanolyl chloride, 2,2-dimethylbutanoyl chloride, 2,3-dimethylbutanoyl chloride, 3,3-dimethylbutanoyl chloride, 2-ethylbutanoyl chloride, heptanoyl chloride, 2-methylhexanoyl chloride, 3-methylhexanoyl chloride, 4-methylhexanoyl chloride, 5-methylhexanolyl chloride, 2,2-dimethylpentanoyl chloride, 2,3-dimethylpentanoyl chloride, 3,3-dimethylpentanoyl chloride, 2-ethylpentanoyl chloride, cyclohexanoyl chloride, octanoyl chloride, 2-methylheptanoyl chloride, 3-methylheptanoyl chloride, 4-methylheptanoyl chloride, 5-methylheptanoyl chloride, 6-methylheptanoyl chloride, 2,2-dimethylhexanolyl chloride, 2,3-dimethylhexanolyl chloride, 3,3-dimethylhexanolyl chloride, 2-ethylhexanoyl chloride, 2-propylpentanoyl chloride, nonanoyl chloride, 2-methyloctanoyl chloride, 3-methyloctanoyl chloride, 4-methyloctanoyl chloride, 5-methyloctanoyl chloride, 6-methyloctanoyl chloride, 2,2-dimethylheptanoyl chloride, 2,3-dimethylheptanoyl chloride, 3,3-dimethylheptanoyl chloride, 2-ethylheptanoyl chloride, 2-propylhexanoyl chloride, 2-butylpentanoyl chloride, decanoyl chloride, 2-methylnonanoyl chloride, 3-methylnonanoyl chloride, 4-methylnonanoyl chloride, 5-methylnonanoyl chloride, 6-methylnonanoyl chloride, 7-methylnonanoyl chloride, 2,2-dimethyloctanoyl chloride, 2,3-dimethyloctanoyl chloride, 3,3-dimethyloctanoyl chloride, 2-ethyloctanoyl chloride, 2-propylheptanoyl chloride, 2-butylhexanoyl chloride and the like.

As the acid anhydride, for example, carboxylic acid anhydride corresponding to the acyl group included in B), and C) the acyl group may be used. Examples of the carboxylic acid anhydride include acetic anhydride, propionic anhydride, butyric anhydride, valeric anhydride, hexanoic anhydride, heptanoic anhydride, octanoic anhydride, 2-ethylhexanoic anhydride, nonanoic anhydride and the like.

Meanwhile, as described above, it is preferred that the cellulose derivative in the present invention does not have carboxylic acid as a substituent, and thus, it is preferred not to use a compound having carboxylic acid produced by reacting with cellulose, such as dicarboxylic acid such as anhydrous phthalic acid and anhydrous maleic acid.

As a catalyst, an acid may be used. Examples of preferred acids include sulfuric acid, methanesulfonic acid, p-toluene sulfonic acid, perchloric acid, phosphoric acid, trifluoroacetic acid, trichloroacetic acid and the like. More preferably, the examples thereof include sulfuric acid and methanesulfonic acid. Further, bisulfate may be used, and examples thereof include lithium bisulfate, sodium bisulfate and potassium bisulfate. In addition, a solid acid catalyst may be used, and examples thereof include polymer solid acid catalysts such as an ion exchange resin, solid acid catalysts based on inorganic oxides, which is exemplified by zeolite, and carbon-type solid acid catalysts such as those used in Japanese Patent Application Laid-Open No. 2009-67730. Furthermore, a Lewis acid catalyst may be used, and examples thereof include titanic acid ester catalysts such as those used in U.S. Pat. No. 2,976,277, and zinc chloride.

As a catalyst, a base may be used. Examples thereof include pyridines, alkali metal salts of acetic acid such as sodium acetate, dimethylaminopyridine, and anilines.

There is also a reaction system in which the esterification reaction proceeds even though a catalyst is not used. Examples thereof include reactions systems using N,N-dimethylacetamide as a solvent, and acetyl chloride or propionyl chloride as an acetylating agent.

As a solvent, a general organic solvent may be used. Among them, carboxylic acid-based or carboxamide-based solvents are preferred. As a carboxylic acid, carboxylic acid corresponding to the acyl group included in B) and the acyl group included in C) may be used. When carboxylic acid is used, ethyl acetate or acetonitrile may be used in combination. As a carboxamide-based solvent, there are those used in Japanese Patent Application Laid-Open No. 10-5117129 or U.S. Pat. No. 2,705,710, and examples thereof include N,N-dimethylacetamide. Further, dimethyl sulfoxide including lithium chloride used in Japanese Patent Application Laid-Open No. 2003-41052 may be used. In addition, a halogenating solvent may be used, and is preferably dichloromethane. Furthermore, pyridine may be used, which may be used as a base. In addition, as used in Japanese Patent Application Laid-Open No. Hei 9-157301, acid chloride used as an esterifying agent may be used as a solvent.

A cellulose derivative (including cellulose) used as a raw material is produced from biomass resources such as cotton linters and wood pulp. Raw materials other than cellulose derivatives may be produced from biomass resources. Examples thereof include acetic acid or anhydrous acetic acid produced by a fermentation method from ethanol produced from cellulose-based biomass or starch-based biomass.

As a pre-treatment, as in Japanese Patent No. 2754066, carboxylic acid or acetic acid including a small amount of a acid catalyst may be added to a cellulose derivative as a raw material and may be mixed.

Prior to use, the cellulose derivative as a raw material may be dried to reduce moisture contained in the cellulose derivative. The moisture contained is responsible for a side reaction of reacting with anhydrous acetic acid, and thus, it is possible to reduce the amount of anhydrous acetic acid used by reducing the moisture contained.

As in Japanese Patent No. 2754066, the rate of the esterification reaction may be controlled by adding the catalyst in parts, or changing the addition rate or combining these. The esterification reaction is an extremely exothermic reaction and the reaction solution also becomes highly viscous, and thus, the esterification reaction is effective when it is difficult to remove heat.

As in Japanese Patent Application Laid-Open No. Sho 60-139701, a reaction product may be concentrated by condensing vapor generated by reducing pressure in the reaction system for the whole period of the esterification reaction or for some periods including the initial phase to release the vapor out of the reaction system. In this method, the heat of reaction generated by the esterification reaction may be taken away by the latent heat of vaporization of a volatile solvent to remove heat.

As in Japanese Patent Application Laid-Open No. 2000-511588, the esterification reaction may be performed in multiple steps. For example, cellulose may be reacted with a first acetylating agent as a first step in the presence of a base catalyst, followed by reaction as a second step with a second acetylating agent in the presence of an acid catalyst.

If the temperature of the esterification reaction is high, the rate of the esterification reaction may become rapid, and thus, the reaction time may be reduced. However, the molecular weight is likely to be reduced by the depolymerization reaction. If the temperature is low, the esterification reaction is delayed. It is preferred that the reaction temperature and time are controlled according to the structure of a desired cellulose derivative and desired molecular weights (Mn and Mw).

When the esterification is performed, the reaction may be performed by irradiating ultrasonic waves as in International Publication No. WO 2001/070820.

In the esterification reaction, the mixture in the reactor progressively changes from the solid-liquid state to a dope-type as the reaction proceeds, and thus, the doping viscosity in the reaction system is increased to a very high value. As described in Japanese Patent Publication No. Hei 2-5761, the doping viscosity is further increased in a method of performing the esterification reaction under reduced pressure conditions while gas-phase components in the reaction system are being distilled away out of the reaction system. As shown in these, when the doping viscosity is increased to a very high value, it is preferred to use a biaxial kneader as an esterification reactor. In addition, the doping viscosity may be lowered to use a general-purpose glass-lined reaction vessel and the like, by increasing the amount of carboxylic acid in the solvent or using other organic solvents in combination to decrease the concentration of the reaction solution.

After the esterification process is completed, a base (generally in the form of an aqueous solution), or water (alcohol may also be used) is added thereto to degrade unreacted anhydrous acetic acid and stop the reaction. An acid catalyst is neutralized when a base is added, while the acid catalyst is not neutralized when water is added. Although it is generally preferred to neutralize the catalyst, the catalyst may not be neutralized. It is better to neutralize the catalyst, for example, when the thermal stability of a synthesized polymer is reduced by effects of bonding sulfuric acid bonded to the cellulose derivative. Further, a method of reducing the amount of bonding sulfuric acid may include a method for neutralizing the bonding sulfuric acid not at once, but step by step while maintaining liquid property that is easily degradable, by means of adding a base continuously, as described in Japanese Patent Application Laid-Open No. 2006-89574. What is used as a neutralizing agent is not particularly limited so long as the agent is a base. However, preferable examples thereof include alkali metal compounds or alkaline earth metal compounds, and specific examples thereof include sodium acetate, potassium acetate, calcium acetate, magnesium acetate, calcium hydroxide, magnesium hydroxide and the like.

A method for separating a desired cellulose derivative is not particularly limited, and methods such as, for example, precipitation, filtration, washing, drying, extraction, concentration and column chromatography may be used either alone or in combination of two or more species appropriately. However, from the standpoint of manipulability, purification efficiency and the like, it is preferred to use a method for separating the cellulose derivative by precipitation (reprecipitation) manipulation. The precipitation manipulation is performed by mixing a solution containing the cellulose derivative with a poor solvent in a manner of introducing the reaction solution containing the cellulose derivative into the poor solution of the cellulose derivative, or introducing the poor solution into the solution containing the cellulose derivative.

As a poor solvent of a desired cellulose derivative, a solvent which is low in solubility in the cellulose derivative may be used, and examples thereof include diluted acetic acid, water, alcohols and the like. Preferably, the poor solvent is diluted acetic acid or water.

A method for solid-liquid separation of the obtained precipitate is not particularly limited, and methods such as filtration and sedimentation may be used. Preferably, the method is filtration, and may use various dehydrators using depressurization, pressurization, gravitational force, compression, centrifugation and the like. Examples thereof include a vacuum dehydrator, a pressurized dehydrator, a belt press, a centrifugal filtration dehydrator, a vibrating screen, a roller press, a belt screen and the like.

Acetic acid, acids used as acid catalysts, solvents, and dissociated metal components are frequently removed from the separated precipitate by washing, for example, with water. Particularly, it is preferred to remove acetic acid and acids used as acid catalysts because they are responsible for molecular weight reduction of a resin during molding and accordingly, degradation in physical performance.

A neutralizing agent may be added during washing. What is used as a neutralizing agent is not particularly limited so long as the agent is a base. Preferable examples thereof include alkali metal compounds or alkaline earth metal compounds, and specific examples thereof include sodium acetate, potassium acetate, calcium acetate, magnesium acetate, calcium hydroxide, magnesium hydroxide and the like. Further, as in Japanese Patent Publication No. Hei 6-67961, a buffer solution may be used in the washing.

A drying method is not particularly limited, and drying may be performed under conditions of blow drying, depressurization and the like, or various dehydrators may be used.

Other detailed preparation conditions may be set according to a general method. For example, see a method described on pages 131 to 164 of "Dictionary of Cellulose" (Asakura Publishing Co., Ltd., 2000).

3. Resin Composition and Molded Body

A resin composition of the present invention contains the above-described cellulose derivative, and may contain other additives if necessary.

The content of the component contained in the thermo-molding material is not particularly limited. The content of the cellulose derivative is preferably 75 mass % or more, more preferably 80 mass % or more, and even more preferably 80 to 100 mass %.

The thermo-molding material of the present invention may include various additives such as a filler and a flame retardant, if necessary, in addition to the cellulose derivative of the present invention.

The resin composition of the present invention may contain a filler (reinforcing material). By containing a filler, mechanical properties of a molded body formed may be reinforced.

As a filler, a known matter may be used. The shape of the filler may be any one of a fiber type, a plate type, a particle type and a powder type. Further, the filler may be an inorganic material or an organic material.

Specific examples of the inorganic filler include a fiber type inorganic filler such as glass fiber, carbon fiber, graphite fiber, metal fiber, potassium titanate whisker, aluminum borate whisker, magnesium-based whisker, silicon-based whisker, wollastonite, sepiolite, slag fiber, xonotlite, ellestadite, gypsum fiber, silica fiber, silica-alumina fiber, zirconia fiber, boron nitride fiber, silicon nitride fiber and boron fiber; or a plate type or particle type inorganic filler such as glass flake, non-swelling mica, carbon black, graphite, metal foil, ceramic bead, talc, clay, mica, sericite, zeolite, bentonite, dolomite, kaolin, fine silicate, feldspar sand, potassium titanate, shirasu balloon, calcium carbonate, magnesium carbonate, barium sulfate, calcium oxide, aluminum oxide, titanium oxide, magnesium oxide, aluminum silicate, silicon oxide, aluminum hydroxide, magnesium hydroxide, gypsum, novaculite, dawsonite and white clay.

Examples of the organic filler include synthetic fiber such as polyester fiber, nylon fiber, acryl fiber, regenerated cellulose fiber and acetate fiber, natural fiber such as kenaf, ramie, cotton, jute, hemp, sisal, Manila hemp, flax, linen, silk and wool, a fiber type organic filler obtained from microcrystalline cellulose, sugar cane, wood pulp, tissues and waste paper, or a particle type organic filler such as an organic pigment.

When the resin composition contains a filler, the content thereof is not limited, but the content may be generally 30 parts by mass or less, and preferably 5 to 10 parts by mass, based on 100 parts by mass of the cellulose derivative.

The resin composition of the present invention may contain a flame retardant. By this, a flame retardant effect may be improved, which decreases or suppresses a combustion speed.

The flame retardant is not particularly limited, and may be one commercially available. For example, a bromine-based flame retardant, a chlorine-based flame retardant, a phosphorus-containing flame retardant, a silicon-containing flame retardant, a nitrogen compound-based flame retardant, an inorganic-based flame retardant, and the like, may be exemplified. Among them, the phosphorus-containing flame retardant and silicon-containing flame retardant are preferable, because corrosion of processing machines or molds, or deterioration of operation environments are not caused by the halogenated hydrogen generated by thermal decomposition when compositing with the resin or molding processing, and also, it is unlikely that the environment would be negatively affected by harmful materials such as dioxins generated by dispersing or decomposing halogen gas during incineration and discarding.

The phosphorus-containing flame retardant is not particularly limited, and may be commercially available. For example, an organic phosphorus-based compound such as phosphate ester, condensed phosphate ester and polyphosphate may be used.

Specific examples of phosphate ester include trimethyl phosphate, triethyl phosphate, tributyl phosphate, tri(2-ethylhexyl) phosphate, tributoxyethyl phosphate, triphenyl phosphate, tricresyl phosphate, trixylenyl phosphate, tris(isopropylphenyl) phosphate, tris(phenylphenyl) phosphate, trinaphthyl phosphate, cresyldiphenyl phosphate, xylenyldiphenyl phosphate, diphenyl(2-ethylhexyl) phosphate, di(isopropylphenyl) phenylphosphate, monoisodecyl phosphate, 2-acryloyloxyethyl acid phosphate, 2-methacryloyloxyethyl acid phosphate, diphenyl-2-acryloyloxyethyl phosphate, diphenyl-2-methacryloyloxyethyl phosphate, melamine phosphate, dimelamine phosphate, melamine pyrrophosphate, triphenyl phosphine oxide, tricresyl phosphine oxide, diphenyl methane phosphonate, diethyl phenylphosphonate and the like.

Condensed phosphate ester may include, for example, aromatic condensed phosphate ester such as resorcinol polyphenylphosphate, resorcinol poly(di-2,6-xylyl)phosphate, bisphenol A polycresylphosphate, hydroquinone poly(2,6-xylyl)phosphate, and a condensate thereof.

Further, polyphosphate formed of salts of phosphoric acid, polyphosphoric acid with a metal of Groups 1 to 14 of the periodic table, ammonia, aliphatic amine and aromatic amine may be exemplified. The representative salt of polyphosphate may include a metal salt such as lithium salt, sodium salt, calcium salt, barium salt, iron (II) salt, iron (III) salt, aluminum salt, and the like, aliphatic amine salt such as methylamine salt, ethylamine salt, diethylamine salt, triethylamine salt, ethylenediamine salt and piperazine salt, and aromatic amine salt such as pyridine salt and triazine.

In addition to the above, halogen-containing phosphate ester such as trischloroethylphosphate, trisdichloropropylphosphate, tris(β-chloropropyl)phosphate), a phosphagen compound having a structure in which a phosphorus atom and a nitrogen atom are linked by a double bond, and phosphate ester amide may be exemplified.

The phosphorus-containing flame retardants may be used either alone or in combination of two or more species.

The silicon-containing flame retardant may include an organic silicon compound having a two or three dimensional structure, polydimethylsiloxane, a compound in which a methyl group of a side chain or a terminal of polydimethylsiloxane is substituted or modified by a hydrogen atom, a substituted or unsubstituted aliphatic hydrocarbon group, and an aromatic hydrocarbon group, so-called silicone oil or modified silicone oil.

Examples of the substituted or unsubstituted aliphatic hydrocarbon group and aromatic hydrocarbon group include an alkyl group, a cycloalkyl group, a phenyl group, a benzyl group, an amino group, an epoxy group, a polyether group, a carboxyl group, a mercapto group, a chloroalkyl group, an alkyl higher alcohol ester group, an alcohol group, an aralkyl group, a vinyl group or a trifluoromethyl group.

The silicon-containing flame retardants may be used either alone or in combination of two or more species.

Further, examples of a flame retardant other than the phosphorus-containing flame retardant or silicon-containing flame retardant include an inorganic-based flame retardant such as magnesium hydroxide, aluminum hydroxide, antimony trioxide, antimony pentoxide, soda antimonate, zinc hydroxystannate, zinc stannate, metastannic acid, tin oxide, tin oxide salt, zinc sulfate, zinc oxide, ferrous oxide, ferric oxide, stannous oxide, stannic oxide, zinc borate, ammonium borate, ammonium octamolybdate, metal salt of tungsten acid, complex oxide of tungsten and metalloid, ammonium sulfamate, ammonium bromide, a zirconium-based compound, a guanidine-based compound, a fluorine-based compound, graphite and swelling graphite. The other flame retardants may be used either alone or in combination of two or more species.

When the resin composition of the present invention contains a flame retardant, the content thereof is not limited, but the content may be generally 30 parts by mass or less, and preferably 2 to 10 parts by mass, based on 100 parts by mass of the cellulose derivative. By setting the content to the above range, it is possible to improve impact resistance and brittleness, or to suppress occurrence of pellet blocking.

The resin composition of the present invention may include other components for the purpose of further improving various properties such as moldability, flame retardancy, and the like, within a scope in which the object of the present invention is not hindered, in addition to the cellulose derivative, filler and flame retardant.

Examples of the other components include a polymer other than the cellulose derivative, a plasticizer, a stabilizer (antioxidant, UV absorbing agent, and the like), a release agent (fatty acid, fatty acid metal salt, oxy fatty acid, fatty acid ester, aliphatic partially saponificated ester, paraffin, low molecular weight polyolefine, fatty acid amide, alkylene-bis fatty acid amide, aliphatic ketone, fatty acid lower alcohol ester, fatty acid polyvalent alcohol ester, fatty acid polyglycol ester and modified silicone), an antistatic agent, a flame retardant formulation, a processing formulation, a drip inhibitor, an antimicrobial, an anti-fungal agent and the like. Further, a coloring agent including a dye or pigment may be added.

As the polymer other than the cellulose derivative, a thermoplastic polymer or a thermosetting polymer may be used, but the thermoplastic polymer is preferable from the standpoint of moldability. Specific examples of the polymer other than the cellulose derivative include polyolefins such as low density polyethylene, straight chain type low density polyethylene, high density polyethylene, polypropylene, ethylene-propylene copolymer, ethylene-propylene-non-conjugated diene copolymer, ethylene-butene-1 copolymer, polypropylene homopolymer, polypropylene copolymer (ethylene-propylene block copolymer, and the like), poly-butene-1 and poly-4-methylpentene-1, polyesters such as polybutylene terephthalate, polyethylene terephthalate and other aromatic polyester, polyamides such as nylon 6, nylon 46, nylon 66, nylon 610, nylon 612, nylon 6T and nylon 12, polystyrene, high impact polystyrene, polyacetal (including homopolymer and copolymer), polyurethane, aromatic and aliphatic polyketone, polyphenylene sulfide, polyether ether ketone, thermoplastic starch resin, acryl resins such as polymethyl methacrylate or methacrylic ester-acrylic ester copolymer, AS resin (acrylonitrilestyrene copolymer), ABS resin, AES resin (ethylene-based rubber reinforced AS resin), ACS resin(chlorinated polyethylene reinforced AS resin), ASA resin (acryl-based rubber reinforced AS resin), polyvinyl chloride, polyvinylidene chloride, vinyl ester-based resin, maleic anhydride-styrene copolymer, MS resin (methyl methacrylate-styrene copolymer), polycarbonate, polyarylate, polysulfone, polyether sulfone, phenoxy resin, polyphenylene ether, modified polyphenylene ether, thermoplastic polyimides such as polyether imide, fluorine-based polymers such as polytetrafluoroethylene, tetrafluoroethylene-hexafluoropropylene copolymer, tetrafluoroethylene-ethylene copolymer, tetrafluoroethylene-perfluoroalkyl vinyl ether copolymer, polychlorotrifluoroethylene, polyvinylidene fluoride and tetrafluoroethylene-hexafluoropropylene-perfluoroalkyl vinyl ether copolymer, cellulose acetate, polyvinyl alcohol, unsaturated polyester, melamine resin, phenol resin, urea resin, polyimide, and the like. Further, there may be various thermoplastic elastomers such as various acryl rubber, ethylene-vinyl acetate copolymer, ethylene-acrylic acid copolymer and alkali metal salt thereof (so-called ionomer), ethylene-alkylester acrylate copolymer (for example, ethylene-ethyl acrylate copolymer and ethylene-butyl acrylate copolymer), diene-based rubber (for example, 1,4-polybutadiene, 1,2-polybutadiene, polyisoprene and polychloroprene), a copolymer of diene and vinyl monomer (for example, styrene-butadiene random copolymer, styrene-butadiene block copolymer, styrene-butadiene-styrene block copolymer, styrene-isoprene random copolymer, styrene-isoprene block copolymer, styrene-isoprene-styrene block copolymer, a copolymer in which styrene is graft copolymerized with polybutadiene, and butadiene-acrylonitrile copolymer), polyisobutylene, copolymer of isobutylene and butadiene or isoprene, butyl rubber, natural rubber, thiokol rubber, polysulfide rubber, acryl rubber, nitrile rubber, polyether rubber, epichlorohydrin rubber, fluorine rubber, silicone rubber, other polyurethanes or polyesters, polyamides.

In addition, a polymer having various degrees of crosslinking, a polymer having various microstructures, for example, a cis structure and a trans structure, a polymer having a vinyl group, a polymer having various average particle diameters, a multilayered structure polymer that is called a core-shell rubber constituted by a core layer, one or more shell layers covering the core layer and the adjacent layers formed of different polymers and core-shell rubber containing a silicon compound may be used.

These polymers may be used either alone or in combination of two or more species.

When the resin composition of the present invention contains a polymer other than the cellulose derivative, the content thereof is preferably 30 parts by mass or less and more preferably 2 parts to 10 parts by mass, based on 100 parts by mass of the cellulose derivative.

The resin composition of the present invention may contain a plasticizer. Therefore, flame retardancy and moldability may be further improved. As the plasticizer, a matter that is commercially used in molding of the polymer may be used. For example, there may be a polyester-based plasticizer, a glycerin-based plasticizer, a polyvalent carboxylic acid ester-based plasticizer, a polyalkyleneglycol-based plasticizer and an epoxy-based plasticizer.

Specific examples of the polyester-based plasticizer include polyester that is formed of an acid component such as adipic acid, sebacic acid, terephthalic acid, isophthalic acid, naphthalene dicarboxylic acid, diphenyldicarboxylic acid and rosin, and a diol component such as propyleneglycol, 1,3-butanediol, 1,4-butanediol, 1,6-hexanediol, ethyleneglycol and diethyleneglycol, or polyester that is formed of hydroxycarboxylic acids such as polycaprolactone. These polyesters may be terminally capped with a monofunctional carboxylic acid or monofunctional alcohol, or may be terminally capped with an epoxy compound and the like.

Specific examples of the glycerin-based plasticizer include glycerin monoacetomonolaurate, glycerin diacetomonolaurate, glycerin monoacetomonostearate, glycerin diacetomonooleate and glycerin monoacetomonomontanate.

Specific examples of the polyvalent carboxylic acid-based plasticizer include phthalic esters such as dimethyl phthalate, diethyl phthalate, dibutyl phthalate, dioctyl phthalate, diheptyl phthalate, dibenzyl phthalate and butylbenzyl phthalate, trimellitic esters such as tributyl trimellitate, trioctyl trimellitate and trihexyl trimellitate, adipic esters such as diisodecyl adipate, n-octyl-n-decyl adipate, methyl diglycol butyldiglycol adipate, benzylmethyldiglycol adipate and benzylbutyldiglycol adipate, citric esters such as triethyl acetylcitrate and tributyl acetylcitrate, azelaic esters such as di-2-ethylhexyl azelate, dibutyl sebacate and di-2-ethylhexyl sebacate.

Specific examples of the polyalkyleneglycol-based plasticizer include polyalkylene glycols such as polyethylene glycol, polypropylene glycol, poly(ethylene oxide.propylene oxide) block and/or random copolymer, polytetramethylene glycol, ethylene oxide addition polymers of bisphenols, propylene oxide addition polymers of bisphenols, and tetrahydrofuran addition polymer of bisphenols, or a terminal-epoxy modified compound thereof, a terminal-ester modified compound thereof and a terminal-ether modified compound thereof.

The epoxy-based plasticizer generally represents the epoxytriglycerides formed of alkyl epoxystearate and soybean oil, but in addition to this, a so-called epoxy resin mainly having bisphenol A and epichlorohydrin as a raw material may be also used.

Specific examples of the other plasticizers may include benzoic esters of aliphatic polyols such as neopentyl glycol dibenzoate, diethylene glycol dibenzoate and triethylene glycol di-2-ethylbutylate, fatty acid amides such as stearic amide, aliphatic carboxylic esters such as butyl oleate, oxylic esters such as methyl acetylricinoleate and butyl acetylricinoleate, pentaerythritol, various sorbitols, and the like.

When the resin composition of the present invention contains a plasticizer, the content thereof is generally 5 parts by mass or less, preferably 0.005 parts to 5 parts by mass and more preferably 0.01 parts to 1 part by mass, based on 100 parts by mass of the cellulose derivative.

The molded body of the present invention is obtained by molding the resin composition including the cellulose derivative. More specifically, the molded body is obtained by a manufacturing method including a process for heating the cellulose derivative, or the resin composition including the cellulose derivative and, if necessary, various additives and molding it by various molding methods.

The molding method may include, for example, injection molding, extrusion molding, blow molding and the like.

The heating temperature is generally 160° C. to 300° C., and preferably 180° C. to 260° C.

A use of the molded body of the present invention is not particularly limited, but may include, for example, interior or exterior parts of electric and electronic devices (devices for home appliances, OA media related devices, optical devices, communication devices and the like), and materials for automobiles, machinery parts, and housing and construction. Among them, from the standpoint of excellent heat resistance, impact resistance and a low load to the environment, for example, the molded body may be suitably used as exterior parts (particularly, case) for electric and electronic devices such as photocopiers, printers, personal computers and televisions.

EXAMPLE

Synthetic Example 1

Synthesis of Acetoxyethylmethylacetyl Cellulose (C-1)

45 g of hydroxyethylmethyl cellulose (trade name: Marpolose ME-250T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, 129 mL of acetyl chloride was slowly added dropwise, followed by increasing the temperature of the system to 80° C. to 90° C. Stirring was continued for 3 hr, and then the temperature of the reaction system was cooled to room temperature. The reaction solution was introduced into 10 L of water while vigorously stirring, whereupon a white solid was precipitated. The white solid was separated by suction filtration, and washed three times with large quantities of water. The obtained white solid was dried under vacuum at 100° C. for 6 hr to obtain a desired cellulose derivative (C-1) (acetoxyethylmethylacetyl cellulose; the degrees of substitution thereof are described in Table 1) as a white powder (57.8 g).

Synthetic Example 2

Synthesis of Acetoxyethylmethylacetyl Cellulose (C-2)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, 129 mL of acetyl chloride was slowly added dropwise, followed by increasing the temperature of the system to 80° C. to 90° C. Stirring was contained for 3 hr, and then the temperature of the reaction system was cooled to room temperature. The reaction solution was introduced into 10 L of water while vigorously stirring, whereupon a white solid was precipitated. The white solid was separated by suction filtration, and washed three times with large quantities of water. The obtained white solid was dried under vacuum at 100° C. for 6 hr to obtain a desired cellulose derivative (C-2) (acetoxyethylmethylacetyl cellulose; the degrees of substitution thereof are described in Table 1) as a white powder (58.5 g).

Synthetic Example 3

Synthesis of Propionyloxyethylmethylpropionyl Cellulose (C-3)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, 158 mL of propionyl chloride was slowly added dropwise, followed by increasing the temperature of the system to 80° C. to 90° C. Stirring was continued for 3 hr, and then the temperature of the reaction system was cooled to room temperature. The reaction solution was introduced into 10 L of water while vigorously stirring, whereupon a white solid was precipitated. The white solid was separated by suction filtration, and washed three times with large quantities of water. The obtained white solid was dried under vacuum at 100° C. for 6 hr to obtain a desired cellulose derivative (C-3) (propionyloxyethylmethylpropionyl cellulose; the degrees of substitution thereof are described in Table 1) as a white powder (79.2 g).

Synthetic Example 4

Synthesis of Propionyloxyethylmethylpropionyl Cellulose (C-4)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, 93.1 mL of propionyl chloride was slowly added dropwise, followed by increasing the temperature of the system to 80° C. to 90° C. Stirring was continued for 3 hr, the temperature of the reaction system was cooled to room temperature, and 100 ml of methanol and 500 ml of water were added. The reaction solution was introduced into 10 L of water while vigorously stirring, and a white solid was separated by suction filtration and washed three times with large quantities of water. The obtained white solid was dried under vacuum at 100° C. for 6 hr to obtain a desired cellulose derivative (C-4) (propionyloxyethylmethylpropionyl cellulose; the degrees of substitution thereof are described in Table 1) as a white powder (50.5 g).

Synthetic Example 5

Synthesis of Butyryloxyethylmethylbutyryl Cellulose (C-5)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel and stirred at room temperature. After it was confirmed that the reaction system became transparent and was completely dissolved, 112.3 mL of butyryl chloride was slowly added dropwise, followed by increasing the temperature of the system to 80° C. to 90° C. Stirring was continued for 3 hr, the temperature of the reaction system was cooled to room temperature, and 100 ml of methanol and 500 ml of water were added. The reaction solution was introduced into 10 L of water while vigorously stirring, and a white solid was separated by suction filtration and washed three times with large quantities of water. The obtained white solid was dried under vacuum at 100° C. for 6 hr to obtain a desired cellulose derivative (C-5) (butyryloxyethylmethylbutyryl cellulose; the degrees of substitution thereof are described in Table 1) as a white powder (55.2 g).

Synthetic Example 6

Synthesis of Acetoxyethylpropionyloxyethylmethylacetylpropionyl Cellulose (C-6)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, a mixture solution of 38.7 mL of acetyl chloride and 46.6 mL of propionyl chloride was slowly added dropwise, followed by increasing the temperature of the system to 80° C. to 90° C. Stirring was continued for 3 hr, the temperature of the reaction system was cooled to room temperature, and 100 ml of methanol and 500 ml of water were added. The reaction solution was introduced into 10 L of water while vigorously stirring, and a white solid was separated by suction filtration and washed three times with large quantities of water. The white solid was dissolved in methanol, and a white solid obtained by dropping the resulting solution into water was dried under vacuum at 100° C. for 6 hr to obtain a desired cellulose derivative (C-6) (acetoxyethylpropionyloxyethylmethylacetylpropionyl cellulose; the degrees of substitution thereof are described in Table 1) as a white powder (59.1 g).

Synthetic Example 7

Synthesis of Acetoxyethylbutyryloxyethylmethylacetylbutyryl Cellulose (C-7)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, a mixture solution of 38.7 ml of acetyl chloride and 56.2 ml of butyryl chloride was slowly added dropwise, followed by increasing the temperature of the system to 80° C. to 90° C. Stirring was continued for 3 hr, the temperature of the reaction system was cooled to room temperature, and 100 ml of methanol and 500 ml of water were added. The reaction solution was introduced into 10 L of water while vigorously stirring, and a white solid was separated by suction filtration and washed three times with large quantities of water. The white solid was dissolved in methanol, and a white solid obtained by dropping the resulting solution into water was dried under vacuum at 100° C. for 6 hr to obtain a desired cellulose derivative (C-7) (acetoxyethylbutyryloxyethylmethylacetylbutyryl cellulose; the degrees of substitution thereof are described in Table 1) as a white powder (60.2 g).

Synthetic Example 8

Synthesis of Butyryloxyethylpropionyloxyethylmethylbutyrylpropionyl Cellulose (C-8)

45 g of hydroxyethylmethyl cellulose (trade name: Marpolose ME-350T; manufactured by Matsumoto Yushi-Seiyaku Co., Ltd.) and 2,250 mL of N,N-dimethyl acetamide were measured and put into a 5-liter three-necked flask equipped with a mechanical stirrer, a thermometer, a cooling tube and a dropping funnel, and stirred at room temperature. After it was confirmed that the reaction system became transparent and was completely dissolved, a mixture solution of 46.6 mL of propionyl chloride and 56.2 mL of butyryl chloride was slowly added dropwise, followed by increasing the temperature of the system to 80° C. to 90° C. Stirring was continued for 3 hr, the temperature of the reaction system was cooled to room temperature, and 100 ml of methanol and 500 ml of water were added. The reaction solution was introduced into 10 L of water while vigorously stirring, and a white solid was separated by suction filtration and washed three times with large quantities of water. The obtained white solid was dried under vacuum at 100° C. for 6 hr to obtain a desired cellulose derivative (C-8) (butyryloxyethylpropionyloxyethylmethylbutyrylpropionyl cellulose; the degrees of substitution thereof are described in Table 1) as a white powder (55.9 g).

Synthetic Example 9

Synthesis of Acetoxyethylmethylacetyl Cellulose (C-9)

30 g of hydroxyethylmethyl cellulose (trade name: Marpolose ME-250T; manufactured by Matsumoto Yushi-Seiyaku Co., Ltd.), 0.74 g of methane sulfonic acid, and 57.4 ml of anhydrous acetic acid were measured and put into a 1-liter kneader (a biaxial Werner type kneader equipped with a sigma blade as a stirrer), and stirred at room temperature for 10 min, the temperature of the reaction system was increased to 35° C., and 120 ml of acetic acid was added dropwise over 30 min and maintained for another 2 hr to perform acetylation. 180 ml of water was slowly added dropwise while stirring. This doping solution was introduced into 420 ml of 10% diluted acetic acid while stirring, and then a white solid was precipitated. The white solid was separated by suction filtration, and washed with large quantities of water. The obtained white solid was dried under vacuum at 100° C. for 6 hr to obtain a desired cellulose derivative (C-9) (acetoxyethylmethylacetyl cellulose; the degrees of substitution thereof are described in Table 1) as a white powder (35.1 g).

Synthetic Example 10

Synthesis of Acetoxyethylmethylacetyl Cellulose (C-10)

30 g of hydroxyethylmethyl cellulose (trade name: Marpolose ME-250T; manufactured by Matsumoto Yushi-Seiyaku Co., Ltd.), 0.37 g of sulfuric acid, and 57.4 ml of anhydrous acetic acid were measured and put into a 1-liter kneader (a biaxial Werner type kneader equipped with a sigma blade as a stirrer), and stirred at room temperature for 10 min, the temperature of the reaction system was increased to 35° C., and 120 ml of acetic acid was added dropwise over 30 min and maintained for another 2 hr to perform acetylation. 180 ml of water was slowly added dropwise while stirring. This doping solution was introduced into 420 ml of 10% diluted acetic acid while stirring, and then a white solid was precipitated. The white solid was separated by suction filtration, and washed with large quantities of water. The obtained white solid was dried under vacuum at 100° C. for 6 hr to obtain a desired cellulose derivative (C-10) (acetoxyethylmethylacetyl cellulose; the degrees of substitution thereof are described in Table 1) as a white powder (36.9 g).

Synthetic Example 11

Synthesis of Propionyloxyethylmethylpropionyl Cellulose (C-11)

30 g of hydroxyethylmethyl cellulose (trade name: Marpolose ME-250T; manufactured by Matsumoto Yushi-Seiyaku Co., Ltd.), 0.74 g of methane sulfonic acid, and 77.2 ml of anhydrous propionic acid were measured and put into a 1-liter kneader (a biaxial Werner type kneader equipped with a sigma blade as a stirrer), and stirred at room temperature for 10 min, the temperature of the reaction system was increased to 35° C., and 120 ml of propionic acid was added dropwise over 30 min and maintained for another 2 hr to perform acetylation. 180 ml of water was slowly added dropwise while stirring. This doping solution was introduced into 420 ml of 10% diluted acetic acid while stirring, and then a white solid was precipitated. The white solid was separated by suction filtration, and washed with large quantities of water. The obtained white solid was dried under vacuum at 100° C. for 6 hr to obtain a desired cellulose derivative (C-11) (propionyloxyethylmethylpropionyl cellulose; the degrees of substitution thereof are described in Table 1) as a white powder (37.6 g).

Meanwhile, with respect to the compounds obtained in the above, the kinds of functional groups substituted with the hydroxyl groups ($R^2$, $R^3$ and $R^6$) contained in cellulose, and DSa, MS, and DSb+DSc were observed and determined by $^1$H-NMR by using the method as described in Cellulose Communication 6, 73-79 (1999).

<Measurement of Molecular Weights of Cellulose Derivatives>

The number average molecular weight (Mn) and weight average molecular weight (Mw) of the cellulose derivative obtained were measured. The measurement method thereof will be described below.

[Molecular Weight and Molecular Weight Distribution]

The number average molecular weight (Mn) and weight average molecular weight (Mw) were determined by using a gel permeation chromatography (GPC). Specifically, N-methylpyrrolidone was used as a solvent and a polystyrene gel was used, and the molecular weight was obtained by using a reduced molecular weight calibration curve previously prepared from a standard monodispersion polystyrene constitution curve. As the GPC device, HLC-8220GPC (manufactured by Tosoh Corp.) was used.

The number average molecular weight (Mn), weight average molecular weight (Mw), and degree of substitution were incorporated and shown in Table 1.

TABLE 1

| | | A) Hydrocarbon group | | B) Group containing acyl group and alkyleneoxy group | | | C) Acyl group | | | |
|---|---|---|---|---|---|---|---|---|---|---|
| | Cellulose Derivative | Kind | DSa | Kind of acyl group | Kind of alkyleneoxy group | MS* | Kind | DSb + DSc | Mn ×10³ | Mw ×10³ |
| Synthetic Example 1 | C-1 | Methyl group | 1.45 | Acetyl group | Ethyleneoxy group | 0.25 | Acetyl group | 1.49 | 388 | 2,524 |
| Synthetic Example 2 | C-2 | Methyl group | 1.43 | Acetyl group | Ethyleneoxy group | 0.26 | Acetyl group | 1.51 | 374 | 2,252 |

TABLE 1-continued

| | Cellulose Derivative | A) Hydrocarbon group | | Kind of acyl group | B) Group containing acyl group and alkyleneoxy group | | C) Acyl group | | Mn ×10³ | Mw ×10³ |
|---|---|---|---|---|---|---|---|---|---|---|
| | | Kind | DSa | | Kind of alkyleneoxy group | MS* | Kind | DSb + DSc | | |
| Synthetic Example 3 | C-3 | Methyl group | 1.44 | Propionyl group | Ethyleneoxy group | 0.25 | Propionyl group | 1.48 | 236 | 897 |
| Synthetic Example 4 | C-4 | Methyl group | 1.45 | Propionyl group | Ethyleneoxy group | 0.25 | Propionyl group | 1.09 | 135 | 555 |
| Synthetic Example 5 | C-5 | Methyl group | 1.45 | Butyryl group | Ethyleneoxy group | 0.25 | Butyryl group | 1.32 | 173 | 630 |
| Synthetic Example 6 | C-6 | Methyl group | 1.45 | Acetyl group Propionyl group | Ethyleneoxy group | 0.25 | Acetyl group Propionyl group | 1.40 | 197 | 702 |
| Synthetic Example 7 | C-7 | Methyl group | 1.45 | Acetyl group Butyryl group | Ethyleneoxy group | 0.25 | Acetyl group Butyryl group | 1.34 | 233 | 654 |
| Synthetic Example 8 | C-8 | Methyl group | 1.45 | Propionyl group Butyryl group | Ethyleneoxy group | 0.25 | Propionyl group Butyryl group | 1.03 | 171 | 502 |
| Synthetic Example 9 | C-9 | Methyl group | 1.43 | Acetyl group | Ethyleneoxy group | 0.25 | Acetyl group | 1.50 | 288 | 880 |
| Synthetic Example 10 | C-10 | Methyl group | 1.44 | Acetyl group | Ethyleneoxy group | 0.25 | Acetyl group | 1.55 | 320 | 950 |
| Synthetic Example 11 | C-11 | Methyl group | 1.43 | Propionyl group | Ethyleneoxy group | 0.26 | Propionyl group | 1.52 | 300 | 1053 |

*MS represents a molar degree of substitution of ethyleneoxy groups

In Table 1, any of "B) a group containing an acyl group and an ethyleneoxy group" in the cellulose derivatives C-1, C-2, C-9 and C-10 is a group containing a structure of the following formula (1-1), any of "B) a group containing an acyl group and an ethyleneoxy group" in the cellulose derivatives C-3, C-4 and C-11 is a group containing a structure of the following formula (1-2), "B) a group containing an acyl group and an ethyleneoxy group" in the cellulose derivative C-5 is a group containing a structure of the following formula (I-3), "B) a group containing an acyl group and an ethyleneoxy group" in the cellulose derivative C-6 is a group containing a structure of the following formula (1-1) and a group containing a structure of formula (1-2), "B) a group containing an acyl group and an ethyleneoxy group" in the cellulose derivative C-7 is a group containing a structure of the following formula (1-1) and a group containing a structure of formula (1-3), and "B) a group containing an acyl group and an ethyleneoxy group" in the cellulose derivative C-8 is a group containing a structure of the following formula (1-2) and a group containing a structure of formula (1-3).

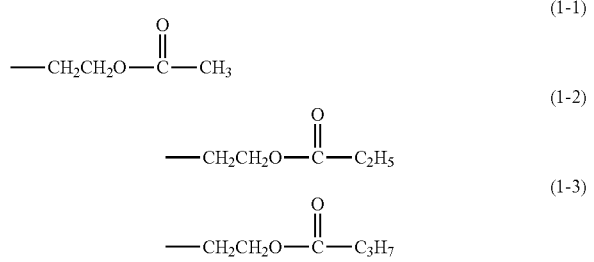

(1-1)
$$\text{---CH}_2\text{CH}_2\text{O}\text{---}\overset{\text{O}}{\underset{\|}{\text{C}}}\text{---CH}_3$$

(1-2)
$$\text{---CH}_2\text{CH}_2\text{O}\text{---}\overset{\text{O}}{\underset{\|}{\text{C}}}\text{---C}_2\text{H}_5$$

(1-3)
$$\text{---CH}_2\text{CH}_2\text{O}\text{---}\overset{\text{O}}{\underset{\|}{\text{C}}}\text{---C}_3\text{H}_7$$

<Measurement of Melting Initiation Temperature of Cellulose Derivatives>

The melting initiation temperatures of the obtained cellulose derivatives and Marpolose as a raw material were measured. The measurement method thereof will be described below.

[Melting Initiation Temperature (Tm)]

A melting initiation temperature was obtained by measuring the flow initiation temperature of a resin while increasing the temperature at a temperature increasing rate of 5° C./min with a load of 100 kg in a flow tester (manufactured by Shimadzu Corporation). The melting initiation temperature is shown in Table 2.

<Measurement of Thermal Decomposition Initiation Temperature of Cellulose Derivatives>

The thermal decomposition initiation temperatures of the obtained cellulose derivatives, and Marpolose as a raw material were measured. The measurement method thereof will be described below.

[Thermal Decomposition Initiation Temperature (Td)]

A thermal decomposition initiation temperature was obtained by measuring a 2% weight reduction temperature of a sample while increasing the temperature at a rate of 10° C./min under nitrogen atmosphere by using a thermogravimetric/differential thermal analysis apparatus (manufactured by Seiko Instruments Inc.). The thermal decomposition initiation temperature is shown in Table 2.

TABLE 2

| | Cellulose derivative | Tm [° C.] | Td [° C.] | Td – Tm [° C.] |
|---|---|---|---|---|
| Synthetic Example 1 | C-1 | 176 | 328 | 152 |
| Synthetic Example 2 | C-2 | 176 | 330 | 154 |
| Synthetic Example 3 | C-3 | 150 | 333 | 183 |
| Synthetic Example 4 | C-4 | 152 | 329 | 177 |
| Synthetic Example 5 | C-5 | 128 | 322 | 194 |
| Synthetic Example 6 | C-6 | 163 | 333 | 170 |
| Synthetic Example 7 | C-7 | 147 | 333 | 186 |
| Synthetic Example 8 | C-8 | 147 | 334 | 187 |
| Synthetic Example 9 | C-9 | 175 | 330 | 155 |
| Synthetic Example 10 | C-10 | 173 | 332 | 159 |
| Synthetic Example 11 | C-11 | 152 | 328 | 176 |
| Reference Example 1 | Marpolose ME-250T | 262 | 305 | 43 |
| Reference Example 2 | Marpolose ME-350T | 250 | 318 | 68 |

As can be seen from Table 2, it is understood that the melting initiation temperature of the obtained cellulose derivative has been greatly reduced for Marpolose as a raw material. In addition, Td-Tm of the obtained cellulose derivative has been greatly increased for Marpolose as a raw material, which indicates that molding is easily carried out by using the thermoplasticity.

The solubility of the obtained cellulose derivative and Marpolose as a raw material in water was measured. The measurement method of the solubility is as follows.

[Measurement of Solubility in Water]

Each sample was added to 100 g of water at 25° C. and stirred to confirm whether the sample was dissolved. The results are shown in the following Table 3. Meanwhile, in the following Table 3, an amount of dissolution of 5 g or less is referred to as "insoluble" and an amount of dissolution of more than 5 g is referred to as "soluble".

TABLE 3

|  | Cellulose derivative | Solubility |
|---|---|---|
| Synthetic Example 1 | C-1 | insoluble |
| Synthetic Example 2 | C-2 | insoluble |
| Synthetic Example 3 | C-3 | insoluble |
| Synthetic Example 4 | C-4 | insoluble |
| Synthetic Example 5 | C-5 | insoluble |
| Synthetic Example 6 | C-6 | insoluble |
| Synthetic Example 7 | C-7 | insoluble |
| Synthetic Example 8 | C-8 | insoluble |
| Synthetic Example 9 | C-9 | insoluble |
| Synthetic Example 10 | C-10 | insoluble |
| Synthetic Example 11 | C-11 | insoluble |
| Reference Example 1 | H-1 | soluble |
| Reference Example 2 | H-2 | soluble |

In Table 3, H-1 is ME-250T (Marpolose: manufactured by Matsumoto Yushi-Seiyaku Co., Ltd.) and H-2 is ME-350T (Marpolose: manufactured by Matsumoto Yushi-Seiyaku Co., Ltd.).

From Table 3, it can be seen that hydroxyethylmethyl cellulose (H-1 and H-2) is dissolved in water and the cellulose derivative of the present invention is insoluble.

Example 1

Manufacture of Molded Body Composed of Cellulose Derivative

[Preparation of Test Piece]

The cellulose derivative (C-1) obtained as described above was fed to an injection molding machine (manufactured by Imoto Machinery Co., Ltd., semi-automatic injection molding apparatus), and molded into a test piece for multipurposes (impact test piece and thermal deformation test piece) having a size of 4×10×80 mm at a cylinder temperature of 200° C., a mold temperature of 30° C., and an injection pressure of 1.5 kgf/cm$^2$.

Examples 2 to 11 and Comparative Examples 1 to 4

In the same manner as in Example 1, test pieces were prepared by molding the cellulose derivatives (C-2) to (C-11) and (H-1) ME-250T (Marpolose: manufactured by Matsumoto Yushi-Seiyaku Co., Ltd.), (H-2) ME-350T (Marpolose: manufactured by Matsumoto Yushi-Seiyaku Co., Ltd.), (H-3) (manufactured by The Dow Chemical Company: ethyl cellulose; degree of substitution of ethoxy: 2.6), and (H-4) (manufactured by Eastman Chemical Company: Cellulose acetate propionate; degree of substitution of acetyl of 0.1; degree of substitution of propionyl: 2.5) as comparative compounds under the molding conditions of Table 4 to be described below.

<Measurement of Physical Properties of Test Pieces>

With respect to the obtained test pieces, the Charpy impact strength and heat deformation temperature (HDT) were measured by the following method. The results are shown in Table 4.

[Charpy Impact Strength]

In accordance with ISO179, the test pieces molded by injection molding were provided with a notch having the front end of 0.25±0.05 mm and an incident angle of 45±0.5°, and stood still under the conditions of 23° C.+2° C. and 50%±5% RH for 48 hours or more, and then the impact strength was measured by a Charpy impact tester (manufactured by Toyo Seiki Seisaku-Sho, Ltd.) with the edge wise.

[Heat Deformation Temperature (HDT)]

In accordance with ISO75, the temperature was measured when a predetermined bending load (1.8 MPa) was applied to the center of a test piece (in a flatwise direction), the temperature was increased at a constant rate, and thus a deformation of the center portion reaches 0.34 mm.

TABLE 4

|  | Cellulose derivative | Cylinder temperature (° C.) | Mold temperature (° C.) | Charpy impact strength (kJ/m$^2$) | HDC (° C.) |
|---|---|---|---|---|---|
| Example 1 | C-1 | 200 | 30 | 18 | 116 |
| Example 2 | C-2 | 200 | 30 | 21.2 | 121 |
| Example 3 | C-3 | 190 | 30 | 14 | 92 |
| Example 4 | C-4 | 190 | 30 | 9 | 84 |
| Example 5 | C-5 | 145 | 30 | 11.3 | 64 |
| Example 6 | C-6 | 200 | 30 | 8.8 | 92 |
| Example 7 | C-7 | 180 | 30 | 9.4 | 96 |
| Example 8 | C-8 | 180 | 30 | 11.1 | 80 |
| Example 9 | C-9 | 200 | 30 | 16.2 | 120 |
| Example 10 | C-10 | 200 | 30 | 15.5 | 130 |
| Example 11 | C-11 | 190 | 30 | 13.5 | 94 |
| Comparative Example 1 | H-1 |  | Not moldable |  |  |
| Comparative Example 2 | H-2 |  | Not moldable |  |  |
| Comparative Example 3 | H-3 | 220 | 30 | 13.8 | 89 |
| Comparative Example 4 | H-4 | 220 | 30 | 2 | 80 |

From the results in Table 4, it is understood that hydroxyethylmethyl celluloses (H-1) and (H-2) do not show thermoplasticity, while cellulose derivatives (C-1) to (C-11) in Examples 1 to 11, which are modified with acyl groups in the celluloses, are given appropriate thermoplasticity, and thus are moldable, as well as exhibit high impact resistance and heat resistance. In addition, although (H-3) and (H-4) in Comparative Examples 3 and 4 were thermo-moldable, it can be understood that cellulose derivatives (C-1) to (C-11) in Examples 1 to 11 are moldable at low temperatures and equivalent or better results are imparted to cellulose derivatives (C-1) to (C-11) in terms of Charpy impact strength and HDT, when compared to the (H-3) and (H-4).

INDUSTRIAL APPLICABILITY

The cellulose derivative or resin composition of the present invention has excellent thermoplasticity, and thus may be manufactured into a molded body. Further, a molded body formed by the cellulose derivative or resin composition of the present invention has good impact resistance, heat resistance and the like, and thus may be used appropriately as component parts such as automobiles, home electric appliances, electric and electronic devices, mechanical parts, materials for housing and construction, and the like. In addition, the cellulose derivative is a plant-derived resin, and a material which may contribute to the prevention of global warming, and thus the cellulose derivative may replace petroleum-derived resins of the related art. Furthermore, the cellulose derivative and resin composition of the present invention exhibit biodegradability, and thus are expected to be used as a material with less environmental load.

Although the present invention has been described with reference to detailed and specific embodiments thereof, it is obvious to those skilled in the art that various changes or modifications may be made without departing from the spirit and scope of the present invention.

The present application claims priority from Japanese Patent Application No. 2009-187416 filed on Aug. 12, 2009 and Japanese Patent Application No. 2009-295059 filed on Dec. 25, 2009, the disclosure of which is incorporated herein by reference in its entirety.

The invention claimed is:

1. A cellulose derivative, comprising
A) a hydrocarbon group;
B) a group containing an acyl group: —CO—$R_B$ and an ethyleneoxy group: —$C_2H_4$—O— wherein $R_B$ represents a hydrocarbon group; and
C) an acyl group: —CO—$R_C$ wherein $R_C$ represents a hydrocarbon group,
wherein the carboxyl group included in the cellulose derivative is in an amount of 0.5% by mass or less, based on the cellulose derivative,
wherein each of A), B) and C) is independently contained in the cellulose derivative, and
wherein the cellulose derivative has degrees of substitution of 1.0<DSa<2.5, 0<DSb and 0.1<DSc<2.0 wherein DSa is the degree of substitution of the hydrocarbon group A) with respect to the hydroxyl groups at the 2-, 3- and 6-positions of a β-glucose ring in a repeating unit, DSb is the degree of substitution of the group containing an acyl group and an ethyleneoxy group B) with respect to the hydroxyl groups at the 2-, 3- and 6-positions of a cellulose structure of a β-glucose ring in a repeating unit and DSc is the degree of substitution of the acyl group C) with respect to the hydroxyl groups at the 2-, 3- and 6-positions of a cellulose structure of a β-glucose ring in a repeating unit.

2. The cellulose derivative of claim 1, wherein A) the hydrocarbon group is an alkyl group having 1 to 4 carbon atoms.

3. The cellulose derivative of claim 1, wherein A) the hydrocarbon group is a methyl group or an ethyl group.

4. The cellulose derivative of claim 1, wherein B) the group containing an acyl group: —CO—$R_B$ and an ethyleneoxy group: —$C_2H_4$—O— is represented by the following Formula (1):

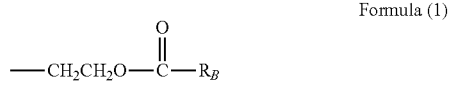

Formula (1)

wherein $R_B$ represents a hydrocarbon group.

5. The cellulose derivative of claim 1, wherein each of $R_B$ and $R_C$ independently represents an alkyl group or an aryl group.

6. The cellulose derivative of claim 1, wherein each of $R_B$ and $R_C$ independently represents a methyl group, an ethyl group or a propyl group.

7. The cellulose derivative of claim 1, wherein the cellulose derivative has no carboxyl group.

8. A method for preparing the cellulose derivative of claim 1, comprising a process of esterifying a cellulose ether containing a hydrocarbon group and a hydroxyethyl group: —$C_2H_4$—OH.

9. A resin composition comprising the cellulose derivative of claim 1.

10. A case for electric and electronic device, composed of a molded body obtained by heating and molding the cellulose derivative of claim 1.

11. A method for preparing a molded body, comprising:
a step of heating and molding the cellulose derivative of claim 1.

* * * * *